United States Patent [19]
Barker

[11] Patent Number: 6,084,462
[45] Date of Patent: Jul. 4, 2000

[54] TEMPERATURE SENSING CIRCUITS

[75] Inventor: Richard J. Barker, Stockport, United Kingdom

[73] Assignee: U.S. Philips Corporation, New York, N.Y.

[21] Appl. No.: 09/129,809

[22] Filed: Aug. 6, 1998

[30] Foreign Application Priority Data

Aug. 8, 1997 [GB] United Kingdom .................... 9716838

[51] Int. Cl.[7] .................................................. H01L 35/00
[52] U.S. Cl. .............................. 327/512; 327/80; 327/83; 324/105
[58] Field of Search ..................................... 327/512, 513, 327/78, 83, 68, 65, 89; 323/312, 315, 316; 324/104, 105

[56] References Cited

U.S. PATENT DOCUMENTS

| | | | |
|---|---|---|---|
| 4,282,477 | 8/1981 | Ahmed ..................................... | 323/312 |
| 4,843,302 | 6/1989 | Dobkin et al. ........................... | 323/312 |
| 4,924,212 | 5/1990 | Fruhauf et al. .......................... | 327/512 |
| 5,336,943 | 8/1994 | Kelly et al. .............................. | 307/310 |
| 5,546,041 | 8/1996 | Szajda ..................................... | 327/512 |
| 5,726,481 | 3/1998 | Moody .................................... | 257/467 |

FOREIGN PATENT DOCUMENTS

0414499A2  2/1991  European Pat. Off. ..

*Primary Examiner*—Jung Ho Kim
*Attorney, Agent, or Firm*—Steven R. Biren

[57] ABSTRACT

A temperature sensing circuit suitable for integration with a power semiconductor device (MOSFET/IGBT) includes temperature-sensing p-n diode means (D1, D2, etc . . . ) integrated together with first and second IGFETs (M1 and M2). A current path through the temperature-sensing p-n diode means (D1, D2, etc . . . ) provides a voltage drop (Vf) having a negative temperature coefficient. The IGFETs (M1 and M2) are coupled in separate current paths from each other so as to have separate gate-to-source voltage signals (Vgs1 and Vgs2) between their source and gate electrodes (s and g). The gate-to-source voltage (Vgs1) of the first IGFET (M1) has a negative temperature coefficient of greater magnitude than the temperature coefficient (if any) of the gate-to-source voltage (Vgs2) of the second IGFET (M2). One of the source and gate electrodes (s or g) of the first IGFET (M1) is coupled to the p-n diode means (D1, D2, etc . . . ), and the first and second IGFETs (M1 and M2) are coupled together as or with a comparator (COMP) to compare the voltage drop (Vf) from the p-n diode means (D1, D2, etc . . . ) with any difference between the gate-to-source voltages (Vgs1 and Vgs2) of the IGFETs (M1 and M2) and so provide a logic output signal (Tabs) indicative of a sensed temperature in relation to a temperature threshold. The IGFETs (M1 and M2) are of the same insulated gate field effect type as each other, typically an N-channel enhancement type, so that the second IGFET (M2) has a gate threshold value ($V_T$) which balances that of the first IGFET (M1) and provides the comparator (COMP) with a precision reference level corresponding to the temperature threshold and less susceptible to variation in process parameters associated with the IGFET threshold voltages.

10 Claims, 4 Drawing Sheets

TEMPERATURE SENSING CIRCUITS

BACKGROUND OF THE INVENTION

This invention relates to temperature sensing circuits comprising insulated gate field effect transistors (hereinafter termed "IGFETs"), particularly but not exclusively suitable for integration with a power semiconductor device, for example a power IGFET (hereinafter termed "MOSFET"), a power insulated gate bipolar transistor (hereinafter termed "IGBT"), or a power bipolar transistor.

U.S. Pat. No. 5,336,943 (our reference PHB 33762) incorporated herein by reference, discloses such a temperature sensing circuit which comprises first and second IGFETs of the same insulated gate field effect type as each other. These IGFETs are coupled in separate current paths from each other so as to have respective gate-to-source voltage signals between their source and gate electrodes. Each IGFET is a diode-connected transistor having its drain electrode coupled to its gate electrode. The first IGFET is operated deep in its sub-threshold region where the voltage across the device varies with temperature. The second IGFET is operated in an area of its square law region where the voltage across the second IGFET is substantially independent of temperature. A comparator circuit compares the voltages across the first and second IGFETs to provide an output signal indicative of the temperature sensed by the first IGFET. Generally two or more series-connected first IGFETs are required to provide an adequate signal level for the comparator circuit. The second IGFET provides the comparator circuit with a reference level corresponding to a temperature threshold. Other temperature sensing circuits using temperature-sensing IGFETs are also referenced in U.S. Pat. No. 5,336,943. The whole contents of U.S. Pat. No. 5,336,943 are hereby incorporated herein as reference material.

An alternative type of temperature sensing circuit using a temperature-sensing p-n diode is disclosed in published PCT International Application WO97/02592 (U.S. Pat. No. 5,726,481; our reference PHB 33990) and the references cited therein, for example, EP-A-0 414 499. The whole contents of these documents are hereby incorporated herein as reference material. This alternative type of circuit comprises a current path through a temperature-sensing p-n diode means to provide a voltage drop having a negative temperature coefficient. Different circuits are possible in which the p-n diode means is either forward-biased or reverse-biased. Generally, the temperature-dependence of the p-n diode forward characteristic is used for temperature sensing, even though the reverse characteristic is known to have a stronger temperature dependence. Thus, the leakage current of a reverse-biased p-n junction increases exponentially with temperature. In the case of a reverse-biased p-n diode the negative-temperature-coefficient voltage drop is generated across a resistor by this current. In the case of a forward-biased p-n diode the negative-temperature-coefficient voltage drop is generated across the p-n diode itself. The temperature-sensing circuit also includes an amplifier comprising an IGFET, the gate electrode of which is coupled to the p-n diode means to provide at its drain electrode an output signal indicative of the sensed temperature.

Such temperature sensing circuits have proved advantageous for regulating the operation of a power semiconductor device to protect it from overheating. Such circuits are particularly advantageous in the field of socalled "smart-power" devices, both to protect the power device section from overheating and to maintain proper operation of its logic circuitry. In this case, control functions provided by low-voltage logic circuitry are integrated at low cost with a high-voltage power device to control its operation, and an improper logic function may result from an excessive temperature increase. Although these known temperature sensing circuits work well, the present applicant finds that a significant spread in the threshold temperature can occur for the same circuit manufactured at different times, i.e different batches of the same circuit. It seems particularly important to control variations in process parameters associated with the IGFET threshold voltage in order to reduce this spread.

It is an aim of the present invention to provide an alternative type of temperature sensing circuit in which the threshold temperature is less susceptible to variation in the process parameters associated with an IGFET threshold voltage, and to provide also an opportunity to adopt a simple integrated circuit configuration.

SUMMARY OF THE INVENTION

According to the present invention there is provided a temperature sensing circuit comprising a current path through a temperature-sensing p-n diode means to provide a voltage drop having a negative temperature coefficient, and first and second transistors of a same insulated gate field effect type as each other and coupled in separate current paths from each other so as to have respective gate-to-source voltage signals between their source and gate electrodes, the gate-to-source voltage of the first transistor having a negative temperature coefficient of greater magnitude than any temperature coefficient of the gate-to-source voltage of the second transistor, one of the source and gate electrodes of the first transistor being coupled to the p-n diode means, and the first and second transistors being coupled together in a comparator circuit which compares the voltage drop from the p-n diode means with any difference between the gate-to-source voltage signals of the first and second transistors to provide an output signal indicative of a sensed temperature in relation to a temperature threshold, the second transistor having a gate threshold value which balances that of the first transistor so as to provide the comparator circuit with a reference level corresponding to the temperature threshold.

So as to facilitate the subsequent discussion, the first and second insulated gate field effect transistors are herein designated first and second IGFETs, the separate gate-to-source voltage signals of the first IGFET and second IGFET are herein respectively designated Vgs1 and Vgs2, and the voltage drop from the p-n diode means is designated Vf. The temperature sensing circuit according to the present invention uses a combination of p-n diode means and IGFET means for the temperature sensing. The comparator circuit compares Vf with any difference between Vgs1 and Vgs2 to provide the output signal indicative of the sensed temperature. The second IGFET provides the comparator circuit with a first-order balanced reference level corresponding to the temperature threshold. The gate threshold value of an IGFET would not normally be considered a precision reference. However, in this instance, any variation in process parameters affecting the gate threshold value of the second IGFET is balanced by the first IGFET which is of the same insulated gate field effect type, so resulting in cancellation of first order variations of gate threshold value as described below. The use of p-n diode means in the temperature sensing section may introduce a potential imbalance into the circuit. However, particularly in the case of a forward-biased p-n diode, variations in process parameters affecting the Vf across the p-n diode means can be controlled to a far higher precision than those affecting an IGFET gate threshold value (either a depletion IGFET or an enhancement IGFET).

A particularly compact and reliable circuit configuration results when the comparator circuit comprises the first and second IGFETs coupled together to compare the Vf from the p-n diode means with any difference between their Vgs1 and Vgs2. In this case, the sensed-temperature output signal of the comparator circuit may be derived from a drain electrode of one of the first and second IGFETs.

In one compact form of the temperature sensing circuit, the p-n diode means may be connected in a series combination with the main current path of the first IGFET to provide a temperature sense section, and the gate electrode of the second IGFET may receive an input signal from the series combination. Depending on the particular circuit configuration the first IGFET may be a diode-connected transistor having its drain electrode coupled to its gate, or it may be used in an amplifier configuration.

The source electrodes of the first and second IGFETs may be coupled to a common voltage supply line. The coupling of the source electrode of the second IGFET to the common voltage supply line may comprise an additional series resistance which is absent from that of the first IGFET to increase the switching threshold (the effective gate threshold voltage) of the second IGFET relative to that of the first IGFET. The first and second IGFETs may each have a back gate electrode in addition to its insulated gate, and the back gate electrodes may be coupled to the same common voltage supply line as the source electrodes.

In another compact form of the temperature sensing circuit, the first and second IGFETs are coupled together as a differential pair to form the comparator circuit, and the p-n diode means is coupled to the gate electrode of the first IGFET. Thus, the p-n diode means may be coupled between the gate electrodes of the first and second transistors.

The drain electrode of the second IGFET may provide the sensedtemperature output signal, possibly via one or more cascaded amplifier stages. However, more amplification can be provided by the first IGFET when operated in its subthreshold region, and so it can be more advantageous for the drain electrode of the first IGFET to provide the sensed-temperature output signal.

The negative temperature coefficient of the Vf from the p-n diode means may be of greater magnitude than the negative temperature coefficient of the Vgs1 of the first IGFET. Either forward-biased or reverse-biased p-n diodes may be used to provide the negative-temperature-coefficient voltage drop. The Vf across a forward-biased p-n diode is generally lower than the source-to-drain voltage drop across a conducting IGFET. This enables two or more temperature-sensitive forward-biased p-n diodes to be connected in series to increase the temperature sensitivity of the negative temperature coefficient of the circuit. Thus, the p-n diode means may comprise a series combination of p-n diodes.

When the temperature sensing circuit is integrated in a compact layout, both the first and second IGFETs may be located in an area exposed (at least to some extent) to the temperature being sensed, although the second IGFET may be spaced away in a somewhat cooler region. Maximum sensitivity can be achieved by making the temperature coefficients of the first and second IGFETs as dissimilar as possible. Thus, the first IGFET may be operated in its sub-threshold region to provide a strong negative temperature coefficient, and the second IGFET may be operated in an area of its square law region. In the square law region the voltage across the second IGFET can be substantially independent of temperature or it can be slightly positive. Reference can be made to U.S. Pat. No. 5,336,943 for detailed teaching on how to choose design parameters (such as IGFET geometry and bias conditions) for constructing circuits in which IGFETs operate at different current densities so that one IGFET operates in its sub-threshold region to provide a strong negative temperature coefficient while another IGFET of the same insulated gate field effect type operates in its square law region. When such principles are adopted in a temperature sensing circuit in accordance with the present invention, a temperature-sensing p-n diode means is also included, and the second IGFET defines the temperature-threshold reference level (balanced with respect to the gate threshold of the first IGFET) by operating in its square-law region at a different current density to the first IGFET.

In temperature sensing circuits in accordance with the invention the comparator may have an amplifier stage comprising one or more cascaded transistors. Preferably these cascaded transistors are of the same insulated gate field effect type as the first and second IGFETs so as to compensate for process parameter variations which may cause an undesired spread in the gate threshold voltages for different batches of the circuits.

Temperature sensing circuits in accordance with the present invention can be integrated with a power semiconductor device and sense the operating temperature of the power semiconductor device. Thus, the integrated circuit may be laid out such that the p-n diode means and at least the first IGFET are located in the vicinity of a heat generating area of the power semiconductor device. Maximum sensitivity can be achieved when, not merely the p-n diode means, but also the first IGFET is located in the vicinity of the heat-generating area. However, the second IGFET (and other circuit elements not used for sensing the temperature) can be located more advantageously in an area remote from the heat-generating area.

BRIEF DESCRIPTION OF THE DRAWINGS

These and other features in accordance with the present invention are illustrated specifically in embodiments of the invention now to be described, by way of example, with reference to the accompanying diagrammatic drawings, in which.

DESCRIPTION OF THE PREFERRED EMBODIMENTS

The temperature sensing circuits of FIGS. 1 to 6 each include a temperature-sensing p-n diode means D1, D2, etc . . . integrated together with first and second transistors M1 and M2 as an integrated circuit. The first and second transistors M1 and M2 are of the same insulated gate field effect type as each other, which is an N-channel enhancement type in the particular examples illustrated in the drawings. Each circuit comprises a current path through the temperature-sensing p-n diode means D1, D2, etc . . . to provide a voltage drop Vf having a negative temperature coefficient. The IGFETs M1 and M2 are coupled in separate current paths from each other so as to have separate gate-to-source voltage signals Vgs1 and Vgs2 between their source and gate electrodes s and g. The gate-to-source voltage Vgs1 of M1 has a negative temperature coefficient of greater magnitude than the temperature coefficient (if any) of the gate-to-source voltage Vgs2 of M2. One of the source and gate electrodes s or g of M1 is coupled to the p-n diode means D1, D2, etc . . . . The p-n diode means D1, D2, etc . . . and the first and second IGFETs M1 and M2 are coupled together in a comparator circuit (having a comparator COMP) which compares the Vf from the p-n diode means D1, D2, etc . . . with any difference between the Vgs1 and Vgs2 of M1 and M2 to provide an output signal indicative of a sensed temperature in relation to a temperature threshold. The second IGFET M2 has a gate threshold value $V_T$ which balances that of the first IGFET M1 so as to provide the comparator circuit COMP with a reference level corresponding to the temperature threshold.

In the circuits of FIGS. 1 to 5, the temperature-sensing p-n diode means D1, D2, etc . . . is forward-biased, and the negative-temperature-coefficient Vf is the forward voltage drop across the p-n diodes. In the FIG. 6 circuit, the temperature-sensing p-n diode means D1' is reverse-biased and the negative-temperature-coefficient Vf is the voltage drop across a resistor R11 in series with D1'. In the FIG. 5 circuit, the comparator COMP is additional to the IGFETs M1 and M2, whereas the circuits of FIGS. 1 to 4 and FIG. 6 are more compact in forming the comparator COMP from the coupling of M2 to M1. In the specific examples of FIGS. 1 to 6, all of the IGFETs M1, M2, M3, M4, etc are of n-channel enhancement type and are formed in a p-type body region providing a back-gate connection b.

In the compact circuits of FIGS. 1 to 4, and FIG. 6, the comparator circuit COMP comprises M1 and M2 coupled together to compare the voltage drop Vf from the p-n diode means D1, D2, etc . . . with any difference between their Vgs1 and Vgs2. In these compact circuits, the sensed-temperature output signal of the comparator circuit COMP is derived from a drain electrode d of either M1 or M2. The output signal is amplified through cascaded stages of further IGFETs M3, M4, etc . . . which are of the same insulated gate field effect type as M1 and M2 and from part of the same integrated circuit as M1 and M2.

Each of the circuits of FIGS. 1 to 6 comprises first and second power supply lines 1 and 2. The first line 1 may be connected to a positive supply voltage V, while the second line 2 may be connected to a ground terminal or to an internal voltage return level (an internal ground) in a more complex integrated circuit. The circuits of FIGS. 1 to 6 adopt various configurations of D1, D2, M1, M2, M3, etc in parallel current paths between the supply lines 1 and 2 to give various circuit sections MOD1 to MOD8 which nonetheless operate together in their respective circuit so as to perform the same basic comparator function summarised in equation (1) below. Each circuit is now considered in turn.

Figure 1:
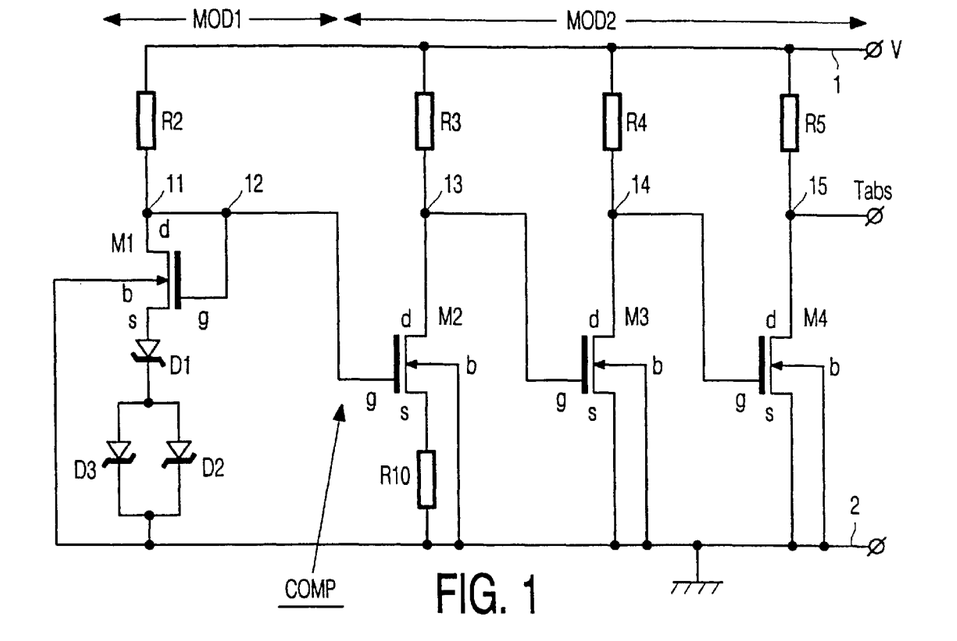
FIGS. 1 to 6 are circuit diagrams of five different embodiments of temperature sensing circuits in accordance with the present invention.

The circuit of FIG. 1 has first and second sections MOD1 and MOD2. The circuit section MOD1 comprises a series chain of a diode-connected IGFET M1 and forward-biased p-n diodes D1 and D2. One end of the series chain is connected to the ground line 2. The other end of the series chain is coupled via a resistor R2 to the line 1 so that an essentially constant current flows through the series chain M1,D1,D2 as defined by the magnitude of R2. The bias conditions are such that the IGFET M1 is operated in its sub-threshold region. The voltage across the series chain M1,D1,D2 is strongly temperature dependent with each of the components M1 and D1 and D2 contributing a variation of about 2 mV per degree Celsius. The ground-connected series chain of M1,D1,D2 fed from the constant-current defining device (resistor R2) produces a node voltage at the nodes 11 and 12 with a strong negative temperature coefficient.

The circuit section MOD2 comprises a cascaded chain of IGFET inverters M2,M3,M4, which is designed and biased so that the input switching threshold of section MOD2 is substantially independent of temperature or has a positive temperature coefficient. In either case, the switching threshold of MOD2 is significantly larger than the threshold voltage $V_T$ of a single IGFET operated in its sub-threshold voltage, because it includes a square law component. Thus, in a particularly simple circuit design, each of the IGFETs M2,M3,M4 may be operated in an area of its square law region where the voltage across the IGFET is substantially independent of temperature. The operating conditions of each IGFET M2,M3,M4 is determined by its channel geometry and by its respective load resistor R3,R4,R5 which couples the drain electrode d of the IGFET to the supply line 1. The source electrode s of each IGFET M2,M3,M4 is coupled to the ground line 2. Each IGFET M2,M3,M4 acts as an amplifying inverter stage which takes an input on its gate electrode g and provides an output at the serial node 13,14 or 15 of its drain electrode d with its load resistor R3,R4 or R5. The output of M2 at node 13 is a logic signal, i.e. "0" before the temperature threshold is exceeded, and "1" after the temperature threshold is reached. This IGFET M2 defines the temperature-threshold reference level (balanced with respect to the gate threshold of M1) by operating in its square-law region at a different current density to M1. The amplified logic-signal output of MOD2 is designated Tabs.

The interconnection of MOD1 and MOD2 is by the gate electrode g of M2 being coupled to the top of the series chain M1,D1,D2. In the particular form illustrated by way of example in FIG. 1, the diode-connected IGFET M1 is at the top of this series chain. The output from MOD1 is taken from a circuit node 12 on the coupling between the gate and drain electrodes g and d of M1. MOD1 constitutes a temperature sense section whose output is coupled to the gate electrode g of M2. MOD2 acts as a ground-referencing comparator section whose switching threshold, as discussed above, is a well-defined voltage offset (at the gate electrode g of M2) with respect to ground. If the temperature of the FIG. 1 circuit is varied such that the voltage across the series chain M1,D1,D2 passes through the switching threshold of MOD2 (as defined by Vgs2 of M2), then M2 will turn on. Thus, MOD2 will perform a comparator function on the signal from M1 and D1,D2 so as to identify precisely a temperature threshold and signal this threshold by changing its Tabs output from "0" to "1".

Thus, the comparator principle employed in this temperature sensing circuit may be expressed by the following function:

$$(\text{Vgs1}-\text{Vgs2})=|\text{Vf}| \qquad (1)$$

where (Vgs1−Vgs2) is the difference between the gate-to-source voltages of the IGFETs M1 and M2, of which Vgs1 has a stronger temperature coefficient than Vgs2;

and |Vf| is the magnitude of the forward voltage drop across the p-n diode means D1, D2 which also has a strong negative temperature coefficient.

The operating conditions of M2 (the first inverter in the cascaded chain M2,M3,M4) define the major component of the input threshold of MOD2. Whereas M1 is biased to operate in its sub-threshold region, M2 is biased to operate in its square law region where its drain current (and its Vgs2) is either independent of temperature or has a slight positive temperature coefficient. Thus, the gate-to-source voltage Vgs2 of M2 determines the input threshold of MOD2 and actually provides a precision reference level (as compared with the temperature-varying Vf of D1,D2 and the temperature varying Vgs1 of M1) for defining the temperature threshold which trips the comparator circuit. Thus, M2 performs both a comparator role and also a precision reference role for its own comparator function with respect to the ground line 2.

An IGFET would not normally be considered as able to define a precision reference level for a comparator circuit, but M2 is able to do so in this circuit which is balanced with respect to MOS gate threshold voltage values $V_T$. Thus, the one $V_T$+square law component of M2 provides the input stage of MOD2, whereas the output of the temperature sense section MOD1 also has just one $V_T$ provided by M1. As M1 and M2 are IGFETs of the same process type, the $V_T$ of M1 in MOD1 offsets any uncertainty in the $V_T$ of M2 due to any inadvertent or unavoidable variations in the manufacturing process which was used to fabricate any particular batch of the FIG. 1 integrated circuit. This offset has the effect of cancelling first order variations in $V_T$. The cancellation is only first order, because the IGFETs M1 and M2 are operating at substantially different current densities, resulting in the Vgs2 of M2 being, for example, at least 0.5 to 0.7 volts higher than the corresponding Vgs1 of the sub-threshold IGFET M1. Thus, at the point when the temperature sensed by (M1+D1+D2) is sufficient to switch M2 from "0" to "1", the following voltage levels may be present in a specific example of the FIG. 1 circuit: Vf of 0.4 volts across D1, and 0.4 volts across D2, 0.5 volts for Vgs of M1, and 1.3 volts for Vgs of M2.

The circuit of FIG. 1 is unbalanced with respect to the forward voltages Vf of the p-n diodes D1,D2, because there are no such diodes in the input of MOD2. However, a p-n diode Vf can be controlled to a far higher precision than a corresponding MOS gate threshold (whether a depletion IGFET or an enhancement IGFET). A p-n diode D1,D2 can exhibit the same level of temperature sensitivity (about −2 mV per degree Celsius), as the Vgs of an IGFET in its sub-threshold region. Furthermore, the lower value of a diode Vf compared with the source-to-drain voltage of a conducting IGFET enables several p-n diodes D1,D2 etc to be connected in series to increase the temperature sensitivity of the circuit. The number of series p-n diodes utilised in the chain M1,D1,D2 is one of the design variables for defining the temperature threshold of the circuit.

The circuit of FIG. 1 has two p-n diodes D1 and D2 and one sub-threshold IGFET M1 as the temperature sensitive components in MOD1. The total temperature sensitivity of these components is approximately −6 mV per degree Celsius, each p-n diode contributing −2 mV and the sub-threshold M1 contributing a further −2 mV per degree Celsius. As the inverter IGFETs M2,M3,M4 of MOD2 are biased to give a negligible or small positive temperature coefficient to the input threshold of MOD2, the equivalent total temperature sensitivity of the FIG. 1 circuit is equal to or more than 6 mV per degree Celsius (measured at node 12). If it is chosen to operate MOD2 with a small positive temperature coefficient, the cascaded inverter IGFETs M2,M3,M4 would operate at a higher drain current density which would marginally increase the temperature sensitivity of the FIG. 1 circuit.

The FIG. 1 circuit may be fabricated with additional circuit components (such as D3 and R10) which can be included in (or omitted from) the circuit by appropriate design of the conductive interconnection pattern of the integrated circuit. Thus, for example, the Vf of the p-n diode means can be modified by the inclusion of a parallel p-n diode D3 to change the effective area of an equivalent single p-n diode corresponding to D1,D2 and D3. The IGFETs M1,M2,M3,M4 of MOD1 and MOD2 each have a back gate electrode b in addition to its insulated gate g. Both the back gate electrodes b and the source electrodes s of these transistors M1,M2,M3,M4 are coupled to the common line 2. However, as illustrated in FIG. 1, the coupling of the source electrode s of M2 to ground line 2 may comprise an additional series resistance R10 which is absent from that of M1, thereby modifying the gate threshold voltage $V_T$ of M2 relative to that of M1. This source degeneration resistance R10 of the first IGFET M2 in the cascaded inverter chain M2,M3,M4 modifies the input threshold of MOD2 and hence the temperature threshold (trip point) of the comparator circuit. Since the performance of both MOD1 and MOD2 varies with the magnitude of the supply voltage V on line 1, the value of this resistance R10 is not so large as to result in a significant dependency of the trip point of the comparator COMP on the magnitude of the supply voltage V.

The FIG. 1 circuit has considerable advantages compared with the temperature sensing circuits of the prior art mentioned hereinbefore. Thus, for example, the temperature threshold and other parameters of the sensing circuit are less susceptible to manufacturing process variations for the integrated circuit. Considerably lower production spreads are therefore achievable. By the optional inclusion of additional components such as R10 and D3, accurate trimming of the circuit characteristics is possible. By connecting M1 and M2 to provide the comparator function, there is no need to provide additional components and additional layout area for the comparator as in U.S. Pat. No. 5,335,943. Similar advantages can also be obtained from alternative circuit configurations of M1 and M2, together with D1,D2 etc in accordance with the present invention.

Figure 2:
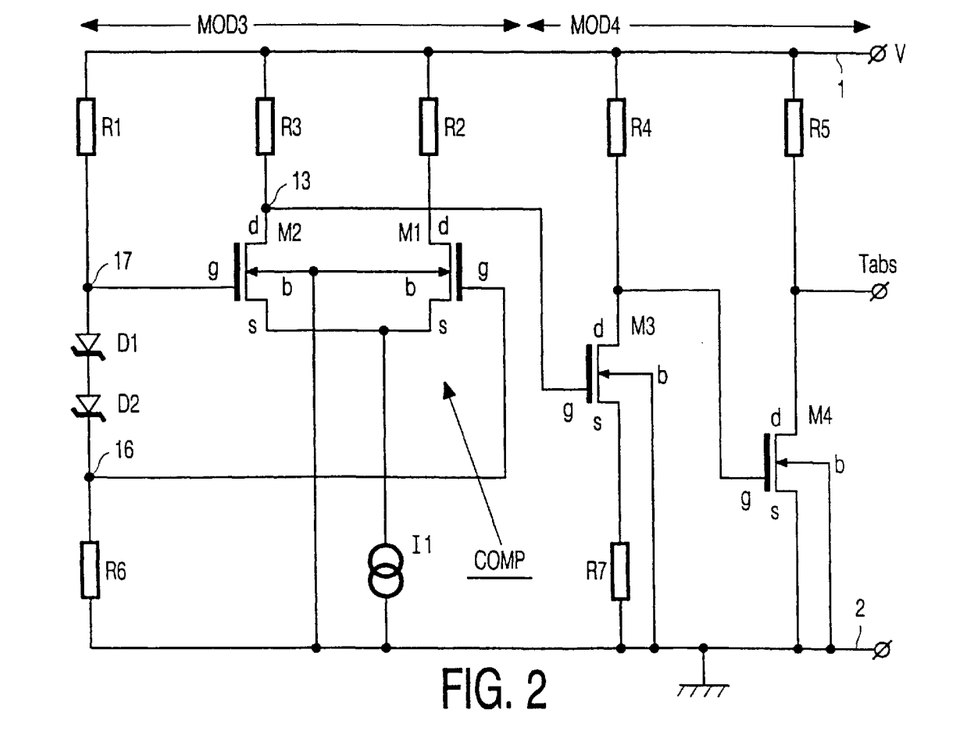

Thus, by way of example, FIG. 2 illustrates the rearrangement of M1 and M2 as a long-tail pair in a differential amplifier configuration. The differential pair of IGFETs M1 and M2 are deliberately operated at different current densities (by their different channel geometries in relation to the values of R2 and R3, in a manner similar to that of FIG. 1) so that M1 in its sub-threshold region and M2 in its square-law region provide together a compound reference/comparator function with a logic output at circuit node 13. In the FIG. 2 circuit, M1 is no longer diode-connected. The p-n diode chain D1,D2 etc is coupled by respective resistors R1 and R6 to the supply lines 1 and 2. The gate electrode g of M1 is connected to the series node 17 of resistor R1 and p-n diode means D1,D2 etc . The gate electrode g of M2 is connected to the series node 16 of R6 with D1,D2 etc, so as to input to COMP a signal with a strong negative temperature coefficient. Thus, in the FIG. 2 circuit, the p-n diode means D1,D2 etc is coupled between the gate electrodes g of the differential pair of M1 and M2. The source electrodes s of M1 and M2 are coupled to the ground line 2 by a current generator 11 which may be implemented in known manner as a current mirror arrangement. Thus, a slight disadvantage of the FIG. 2 circuit is that it requires the provision of additional circuit elements (to provide the current generator 11) as compared with the FIG. 1 circuit.

The differential amplifier circuit configuration of FIG. 2 operates in temperature threshold detection according to the same general principle as the FIG. 1 circuit. Thus, the differential configuration of M1 and M2 subtracts the gateto-source voltages of M1 and M2 to compare the difference between Vgs1 and Vgs2 with the magnitude of the forward voltage drop Vf across the p-n diode means D1,D2, in accordance with the function (1) above. By contrast with FIG. 1, the FIG. 2 circuit comprises M2 as well as M1, D1, D2 together in a first circuit section MOD3 which combines the temperature sensing and comparator function. In a specific example of the FIG. 2 circuit, at the point when the temperature sensed by (M1+D1+D2) is sufficient to switch M2, the following voltage levels may again be present at the comparator inputs: Vf of 0.4 volts across D1, 0.4 volts across D2, 0.5 volts for Vgs of M1 and 1.3 volts for Vgs of M2. The output signal of MOD3 is a logic signal indicative of the sensed temperature in relation to the temperature threshold. A second circuit section MOD4 amplifies this logic signal and comprises M3 and M4 as cascaded inverters in a manner similar to that in FIG. 1.

Figure 3:
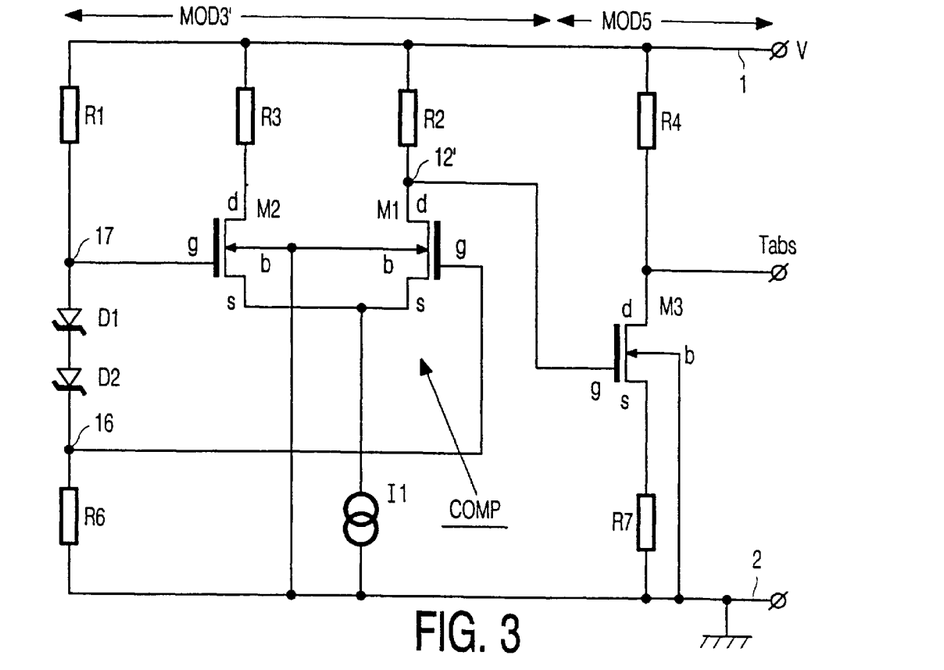

In the FIG. 2 circuit, the input for the next amplifying inverter stage of M3 is taken from the circuit node 13 at the drain electrode d of M2. FIG. 3 shows a modification of the FIG. 2 circuit, in which the input for M3 is taken from circuit node 12' at the drain electrode d of M1. An IGFET when operating in its sub-threshold region (such as M1 is operating) can provide strong gain. However, because M1 forms a differential pair with M2, the gain from the first circuit section MOD3' in the FIG. 3 configuration is no greater than that from MOD3 in the FIG. 2 configuration. In order to keep the desired phase for the output signal Tabs, the second circuit section MOD5 of FIG. 3 must now have an odd number of inverter stages. Thus, for example, FIG. 3 shows only one amplifying inverter stage M3 following the differential pair M1,M2 and forming the second circuit section MOD5.

Figure 4:
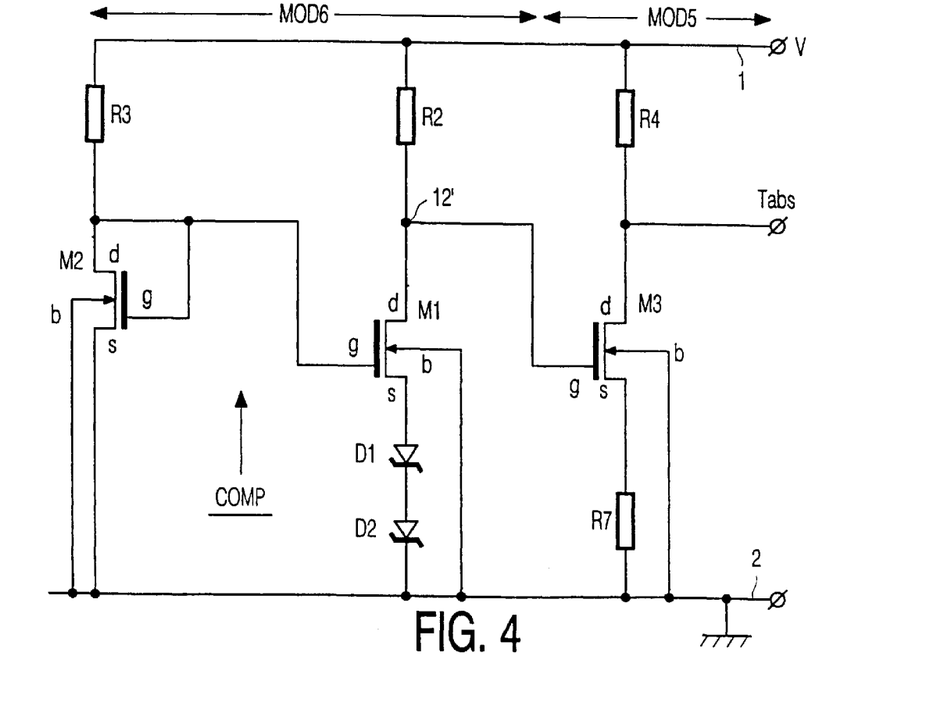

In the FIG. 1 circuit, the drain electrode d of M1 provides an analog sensed-temperature output signal, whereas the drain electrode of M1 in FIG. 3 provides a logic output signal of the comparator COMP. As illustrated in FIG. 4, a modification of the FIG. 1 circuit is possible in which the drain electrode d of M1 (operating in its sub-threshold region) provides the logic output signal with good amplification at circuit node 12' to the input of M3. Thus, an advantage of the FIG. 4 configuration is that M1 operating in its sub-threshold region can provide more amplification of the sensed-temperature output signal in the first circuit section MOD6 so that the number of amplifying inverter stages M3,M4 etc of FIG. 1 can be reduced. In this FIG. 4 circuit, the first circuit section MOD6 now comprises M2 (operating in its square-law region), as well as M1, D1, D2. The second circuit section MOD4 amplifies the sensed temperature signal via a cascaded inverter IGFET M3. In all the circuits of FIGS. 2 to 4, a source degeneration resistor R7 couples the source electrode s of the first inverter IGFET M3 to the supply line 2.

Figure 5:
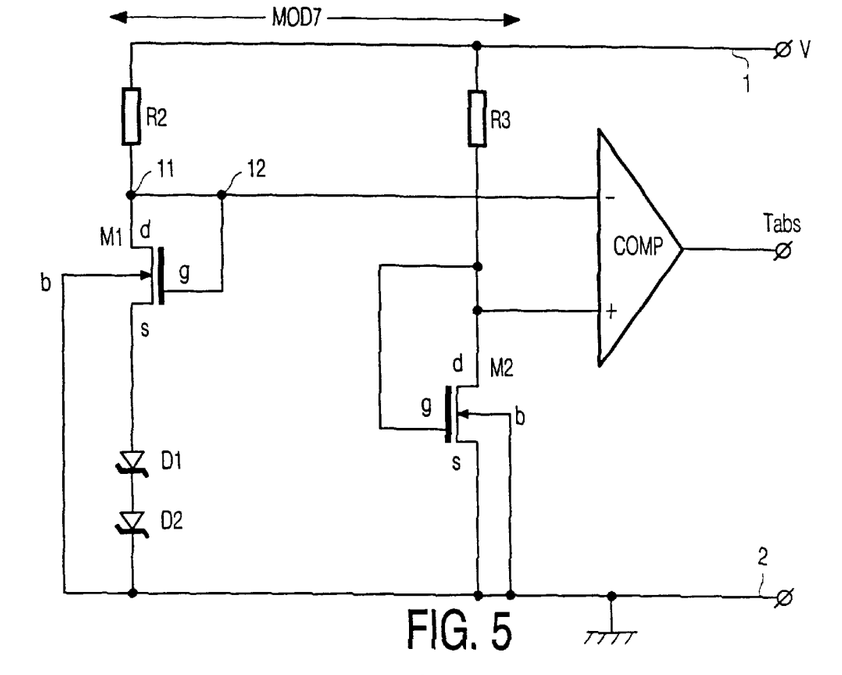

FIGS. 1 to 4 illustrate compact circuit arrangements in accordance with the present invention in which one or both of the IGFETs M1 and M2 provide the comparator function of COMP. However, the principles of the present invention may also be employed in less compact circuits in which the comparator COMP is additional to the IGFETs M1 and M2 and receives its inputs from M1 and M2. An example of such a circuit is illustrated in FIG. 5, having some similarities to the temperature sensing circuits disclosed in U.S. Pat. No. 5,336,943. The comparator COMP may be integrated with the M2,R3,R2,M1,D1,D2 etc of the FIG. 5 circuit, or it may be an external component. As in the circuits of FIGS. 1 to 4, so also in the FIG. 5 circuit, M1 is operated in its sub-threshold region so as to have a negative temperature coefficient, whereas M2 is operated in an area of its square law region where the voltage across M2 is substantially independent of temperature. Unlike the circuits in U.S. Pat. No. 5,336,943, M2 of FIG. 5 is able to provide a precision reference level for the comparator COMP, regardless of any batch variations in the process parameters associated with the threshold voltages $V_T$ of M1 and M2. Thus, M1 with one VT provides the negative input of comparator COMP, whereas the positive input of comparator COMP also comprises just one $V_T$ (+the square law component) provided by M2. Both M1 and M2 are diode-connected IGFETs, having their gate electrode g connected to their drain electrode d. The strong negative temperature coefficient in the FIG. 5 circuit is provided by the series chain of M1,D1,D2, in a manner similar to that of FIG. 1. The comparison made by the comparator COMP of FIG. 5 is in accordance with the function (1) given above.

Figure 6:
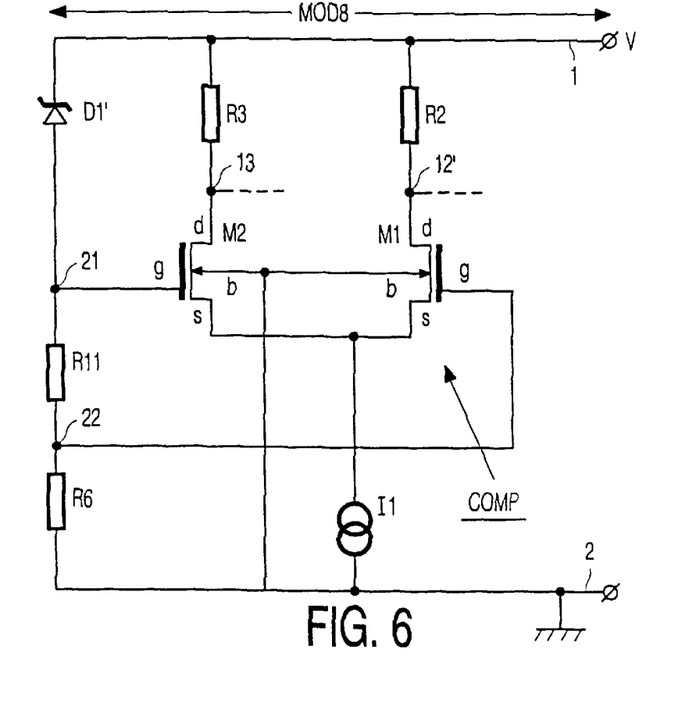

In the circuits of FIGS. 1 to 5, the temperature-sensing p-n diode means D1, D2, etc . . . is forward-biased. FIG. 6 illustrates a modification (for example a modification of the circuit sections MOD 3 or MOD3' of FIGS. 2 and 3), in which the temperature-sensing p-n diode means D1' is reverse-biased to give a leakage current with a strong negative temperature coefficient. This current is fed through a resistor R11 in series with D1' to produce the negative-temperature-coefficient voltage drop (Vf of equation (1)) across R11. The series node 21 of D1' and R11 is coupled to the gate electrode g of M1 operating in its sub-threshold region. The opposite end of R11 is coupled to the gate electrode g of M2 operating in its square law region and forming a differential pair with M1. The resulting circuit section MOD 8 performs both a temperature-sensing function and a compound reference/comparator function (as described above). The logic output of MOD8 may be taken from either the circuit node 12' (with good amplification) or from the circuit node 13. This output signal may be fed to an amplifying inverter section, for example similar to MOD4 or MOD5.

Figure 7:
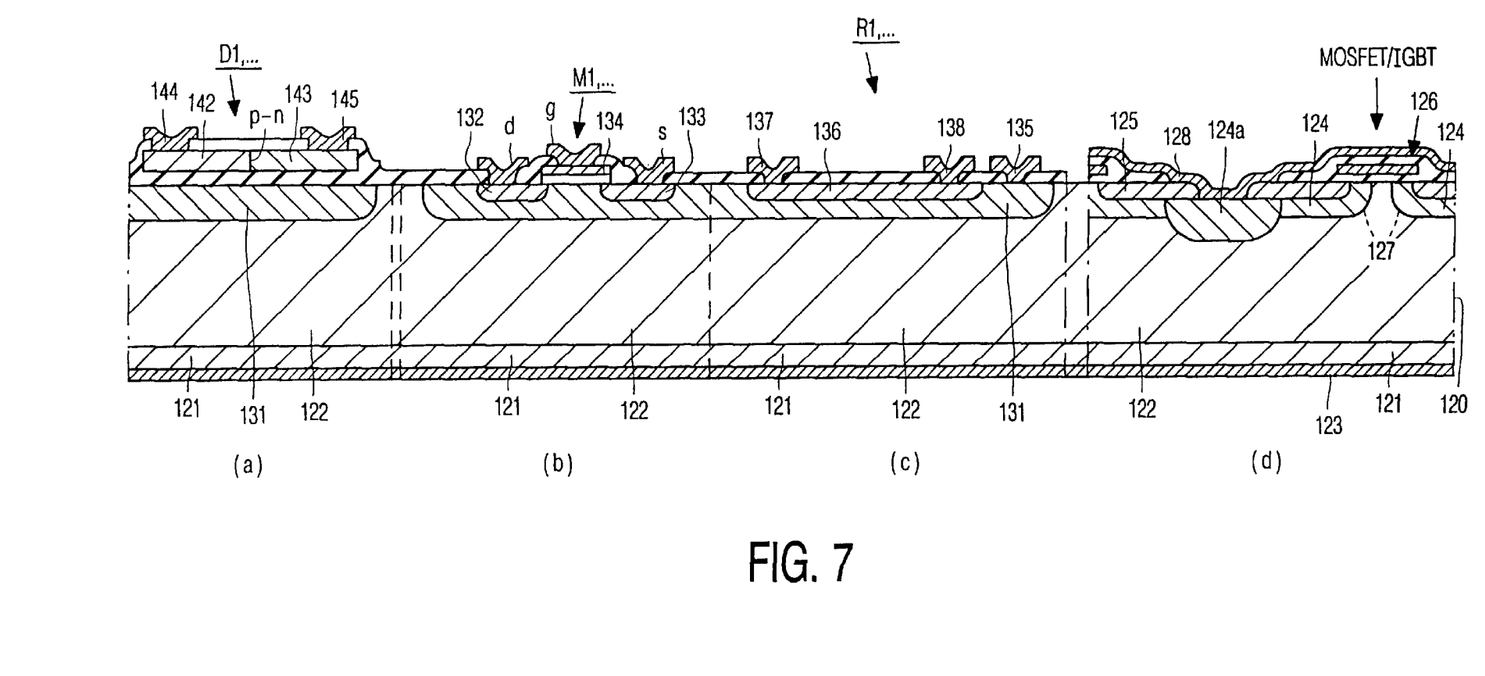
FIG. 7 is a diagrammatic cross-sectional view through part of a semiconductor body, illustrating how the circuits of FIGS. 1 to 6 can be integrated with a power semiconductor device.

FIG. 7 is a cross-sectional view through four parts of a semiconductor body 120, illustrating how the temperature sensing circuits of FIGS. 1 to 6 may be integrated with a power semiconductor device MOSFET or IGBT. Sections (b),(c) and (d) correspond to the sections of an IGFET, resistor and power semiconductor device illustrated in FIG. 2 of U.S. Pat. No. 5,335,943. FIG. 7 uses similar reference numerals to those of U.S. Pat. No. 5,336,943, but incremented by 100.

Thus, the semiconductor body 20 may comprise a relatively highly doped monocrystalline silicon substrate 121 having thereon a relatively lowly doped n conductivity type epitaxial layer 122. In this example, the power semiconductor device MOSFET or IGBT is of vertical configuration and comprises a very large number (hundreds of thousands) of parallel-connected source cells sharing a common drain drift region provided by the epitaxial layer 121. Section (d) of FIG. 7 shows only one such source cell. In the case of a MOSFET, the substrate 121 is of the same conductivity type as the drain drift region and is contacted by a drain electrode 123. In the case of an IGBT, the substrate 121 is of opposite conductivity type and is contacted by an anode electrode 123. Each source cell comprises a p conductivity type transistor-body region 124, within which is formed an n conductivity type source region 125. The transistor-body region 124 may have a more highly doped central region 124a. The regions 125 and 124a are contacted by an electrode 128 which is a source electrode of the MOSFET or a cathode electrode of the IGBT. The power device MOS- FET or IGBT is of the n-channel enhancement type in which an n-type conduction channel 127 is induced in the transistor-body region 124 by an insulated gate 126. Although FIG. 7(d) illustrates a planar cellular geometry for the channel 127 and the gate 126, various known forms of so-called "trench-gate" geometry may be used for MOSFETs and IGBTs, in which the insulated gate 126 is present in a trench in the major surface of the semiconductor body 120, between neighbouring cells. In this case, the channel 127 extends vertically along the side walls of the trench. It will be evident that the temperature sensing circuits of FIGS. 1 to 6 may be integrated with a power semiconductor device of planar geometry as illustrated in FIG. 7(d) or, for example, of trench-gate geometry.

Sections (a), (b), and (c) illustrate areas of the semiconductor body 120 which are located to one or more sides of the power device MOSFET or IGBT and at which the circuit components of a temperature sensing circuit of any one of FIGS. 1 to 6 are integrated. At least the p-n diode means D1,D2 etc and the first IGFET M1 are located in the vicinity of the active area of the power semiconductor device MOSFET or IGBT, which comprises the source cells and generates heat in operation of the power semiconductor device. Sections (a), (b) and (c) of FIG. 7 illustrate the fabrication of these components D1, M1, R1 etc in and on p conductivity type isolation wells 131 adjacent the upper major surface of the semiconductor body 120. One or more of these isolation wells 131 may be provided outside the periphery of the active area of the power device MOSFET or IGBT or surrounded by source cells of the power device MOSFET or IGBT. The wells 131 may be formed in the masking and doping stages used to provide the transistor-body region 124.

N-channel enhancement IGFETs such as M1 can be formed in such a p type isolation well 131 by n type source and drain regions 132 and 133, separated by an insulated gate 134. The regions 132 and 133 may be formed in the masking and doping stages used to provide the source regions 125. A back gate connection for the IGFET can be provided by an electrode 135 contacting the isolation well 131.

Resistors such as R1, etc can be formed within isolation wells 131 by n conductivity type resistance regions 136. These resistance regions 136 may also be formed in the masking and doping stages used to provide the power device source regions 125. However the resistance region of resistors R1, etc . . . can be formed with p type conductivity, with the masking and doping stages used to provide the transistor body region 124. The resistors R1, etc . . . may alternatively be provided as thin-film elements of, for example, doped polycrystalline silicon on an insulating layer on the upper surface of the body 120. Electrodes 137 and 138 contact the resistance region 136 to provide the resistor connections.

P-n diodes such as D1, etc can be formed by p type and n type regions provided in the silicon body 120. However, better isolated p-n diodes can be formed as thin-film elements on an insulating layer on the upper surface of the body 120. Such a thin-film configuration is illustrated in section (a) of FIG. 7. Thus, the diode D1 illustrated in FIG. 7 comprises a p conductivity type region 142 and an n conductivity type region 143 formed side by side in a polycrystalline silicon film to define a p-n junction therebetween. Region 142 is contacted by an electrode 144 and region 143 is contacted by an electrode 145.

The various electrodes s,d,g,135,137,138,144,145 of these circuit components M1,R1,D1 may be formed by the deposition and etching stages used to form the conductive material (generally polycrystalline silicon) of the gate 126 of the power device or by the conductive material (generally metal such as aluminium) of the electrode 128. The circuit connections of these components M1,R1,D1, etc as in FIGS. 1 to 6 are made by interconnection patterns in respective areas of these conductive materials. Thus, the temperature sensing circuits of FIGS. 1 to 6 can be integrated in known manner with power semiconductor devices.

Although FIGS. 1 to 7 illustrate IGFETs of the n-channel enhancement type, it will be evident that temperature sensing circuits in accordance with the present invention can be formed by IGFETs of the p-channel enhancement type or even with IGFETs of the depletion type. In order to obtain a $V_T$ balance in the reference level for the comparator circuit COMP, the IGFETs M1 and M2 are both of the same insulated gate field effect type.

From reading the present disclosure, other modifications and variations will be apparent to persons skilled in the art. Such modifications and variations may involve equivalent features and other features which are already known in the art and which may be used instead of or in addition to features already disclosed herein.

What is claimed is:

1. A temperature sensing circuit comprising a current path through a temperature-sensing p-n diode means to provide a voltage drop across said diode means having a negative temperature coefficient, and first and second transistors of a same insulated gate field effect type as each other and coupled in separate current paths from each other so as to have respective gate-to-source voltage signals between their source and gate electrodes, the gate-to-source voltage of the first transistor having a negative temperature coefficient of greater magnitude than a temperature coefficient of the gate-to-source voltage of the second transistor, one of the source and gate electrodes of the first transistor being coupled to the p-n diode means, and the first and second transistors being coupled together in a comparator circuit which compares the voltage drop from the p-n diode means with a difference between the gate-to-source voltage signals of the first and second transistors to provide an output signal indicative of a sensed temperature in relation to a threshold temperature, the second transistor having a gate threshold value which balances that of the first transistor so as to provide the comparator circuit with a reference voltage level corresponding to the threshold temperature.

2. A temperature sensing circuit as claimed in claim 1, wherein the comparator circuit comprises the first and second transistors coupled together to compare the voltage drop from the p-n diode means with any difference between their gate-to-source voltage signals, and the sensed-temperature output signal of the comparator circuit is derived from a drain electrode of one of the first and second transistors.

3. A temperature sensing circuit as claimed in claim 2, wherein the p-n diode means is connected in a series combination with the main current path of the first transistor to provide a temperature sense section, and the gate electrode of the second transistor receives an input signal from the series combination.

4. A temperature sensing circuit as claimed in claim 3, wherein the source electrodes of the first and second transistors are coupled to a common voltage supply line, and the coupling of the source electrode of the second transistor to the common voltage supply line comprises an additional series resistance which is absent from that of the first transistor to increase the switching threshold voltage of the second transistor relative to that of the first transistor.

5. A temperature sensing circuit as claimed in claim 2, wherein the first and second transistors are coupled together to form the comparator circuit, and the p-n diode means is coupled between the gate electrodes of the first and second transistors.

6. A temperature sensing circuit as claimed in claim 1, wherein the drain electrode of the first transistor provides the sensed-temperature output signal.

7. A temperature sensing circuit as claimed in claim 1, wherein the negative temperature coefficient of the voltage drop from the p-n diode means is of greater magnitude than the negative temperature coefficient of the gate-to-source voltage of the first transistor.

8. A temperature sensing circuit as claimed in claim 7, wherein the p-n diode means comprises a series combination of forward-biased p-n diodes.

9. A temperature sensing circuit as claimed in claim 1, wherein the first transistor is operated in its sub-threshold region to provide its negative temperature coefficient, and the second transistor is operated in an area of its square law region.

10. A temperature sensing circuit as claimed in claim 1, which is integrated with a power semiconductor device and senses the operating temperature of the power semiconductor device, wherein the p-n diode means and at least the first transistor are located in the vicinity of a heat generating area of the power semiconductor device.

* * * * *